United States Patent [19]
Hendriks et al.

[11] Patent Number: 4,544,889
[45] Date of Patent: Oct. 1, 1985

[54] ROBOT PRECISION PROBE POSITIONER WITH GUIDANCE OPTICS

[75] Inventors: Ferdinand Hendriks, San Jose, Calif.; Russell H. Taylor, Ossining, N.Y.

[73] Assignee: International Business Machines Corporation, Armonk, N.Y.

[21] Appl. No.: 530,927

[22] Filed: Sep. 12, 1983

[51] Int. Cl.[4] .................... G01R 1/067; G05B 1/06
[52] U.S. Cl. .................... 324/158 P; 318/640; 356/375
[58] Field of Search .................... 324/158 P, 158 F; 250/227, 491.1, 561, 202; 318/640; 901/47; 356/375

[56] References Cited

U.S. PATENT DOCUMENTS

| | | | |
|---|---|---|---|
| 3,007,097 | 10/1961 | Shelley et al. | 318/640 X |
| 3,264,556 | 8/1966 | Krautz | 324/158 P |
| 3,405,361 | 10/1968 | Kattner et al. | 324/158 P |
| 3,502,882 | 3/1970 | Von Voros | 250/202 |
| 3,532,807 | 10/1970 | Webb | 358/101 |
| 3,719,879 | 3/1973 | Marcy | 318/640 X |
| 3,786,332 | 1/1974 | Hepner et al. | 318/577 |
| 3,888,362 | 6/1975 | Fletcher et al. | 414/620 |
| 3,891,918 | 6/1975 | Ellis | 324/208 |
| 4,087,729 | 5/1978 | Yamazaki et al. | 318/601 |
| 4,203,064 | 5/1980 | Suzuki et al. | 318/640 |

OTHER PUBLICATIONS

IBM Technical Disclosure Bulletin, Beauregard, F., et al., "High-Speed Multiprobe Semiconductor Test Assy.", vol. 8, No. 8, Jan. 1966, p. 1144.

*Primary Examiner*—Stewart J. Levy
*Assistant Examiner*—Stephen M. Baker
*Attorney, Agent, or Firm*—Carl C. Kling

[57] ABSTRACT

This precision probe uses optical feedback in the X and Y dimensions to locate a microprobe in the airspace over a test pad, and uses pressure feedback in the Z dimension to control Z approach and penetration. The precision probe inspects a target by coarse positioning a guided microprobe to make contact at a selected probe pad. Guidance is optical, by light reflected, from a target by a dual mirror focusing system of concave mirror and flat mirror, to a transducer. Up and down Z positioning of the microprobe is carried out by a shaft positioned by an air diaphragm which is driven to the target by applied air pressure delivered via an air tube, providing the desired penetration of microprobe to microtarget. The probe is retracted by atmospheric pressure. In operation, the microprobe is coarsely positioned by the computer and the coarse positioner in the air space above the X-Y coordinates for the probe pad, but tolerances may be such that the microprobe is not precisely positioned within the airspace periphery of the probe pad. Assuming that the precision required is greater than the tolerances available or desired, fine positioning is required. Fine positioning with guidance sensing, using computer preparation of fine positioning control signals and control signal responsive mechanisms built into the microprobe, accomplishes the fine positioning. Precision X-Y positioning is carried out by the voice coil microactuators, respectively, in response to computer control signals delivered via the control cable.

6 Claims, 3 Drawing Figures

ROBOT PRECISION PROBE POSITIONER WITH GUIDANCE OPTICS

BACKGROUND OF THE INVENTION

1. Field of the Invention

The present invention relates to precision positioning of a probe, and more particularly to an optically guided precision probe for use by a robot for accurately positioning a circuit microprobe at each of a number of very precise test locations on a miniaturized circuit.

2. Description of Related Art

Miniaturized integrated circuits and their miniaturized connecting boards have become so small and their circuits have been so miniaturized and have become so complex that manual methods of probing them for testing have become cumbersome and costly. The vast number of repetitions makes the probing operation tedious, and the precision requirements make the probing operation difficult or impossible to carry out without loss of accuracy of test or damage to the circuit under test.

Robot probing ends the tedium problem, helps with the cost problem, and is theoretically capable of precision unattainable by human operators without mechanical aids to precision, but the robot cannot currently compete with the marvelous combination of sensory perception and adaptive movement capability of the human operator. Specialized robot devices may, however, be equipped with sensory devices and accompanied by computer guidance features tied to the sensory devices so as to perform very specialized tasks with precision unmatched by human operators or earlier robots.

Mechanized handling of articles for assembly or test has long been a goal of production planners, and a great number of handling devices have been deployed, with degrees of adaptability varying from zero (hard tooling) to significant adaptability (soft tooling) depending primarily upon operator intervention for setup and control. The use of sensory devices associated with the mechanical gripper, cutting tool, test probe or other effector has been minimal.

U.S. Pat. No. 3,007,097, Shelley et al, AUTOMATIC HANDLING AND ASSEMBLY SERVOSYSTEM, Oct. 31, 1961, shows a lamp and photocell group system mounted on the movable effector to develop location data for the effector.

U.S. Pat. No. 3,502,882, Von Voros, OPTOGRAPHICAL MEMORY AND DIGITALIZED CONTROL SYSTEM FOR PRECISION MACHINING, Mar. 24, 1970, shows optical sensing using fiber optics associated with the effector, arranged to follow a line on a template to provide positioning information for a slave effector which performs the actual cutting operation.

U.S. Pat. No. 3,532,807, (Webb-NASA) Wall et al, AUTOMATIC CLOSED CIRCUIT TELEVISION ARC GUIDANCE CONTROL, Oct. 6, 1970, shows a TV camera mounted on the effector of a seam welder to follow the seam. Light sources are also mounted on the effector to illuminate the seam.

U.S. Pat. No. 3,719,879, Marcy, SYSTEM FOR ACCURATELY POSITIONING AN OBJECT UNDER THE CONTROL OF PROGRAMMED NUMERICAL DATA, Mar. 6, 1973, shows a coarse-fine positioner for use in mask machines used for the manufacture of integrated circuits. A stepping motor provides the course positioning, and piezoelectric ceramics provide the fine displacement upon halting of the motor.

U.S. Pat. No. 3,786,332, Hepner et al, MICRO POSITIONING APPARATUS, Jan. 15, 1974, shows a precision positioning device using piezoelectric fine positioning transducers and a laser-mirror-interferometer system to provide position data, which with error calculation mechanism provides the necessary effector placement precision.

U.S. Pat. No. 3,888,362, Fletcher et al, COOPERATIVE MULTIAXIS SENSOR FOR TELEOPERATION OF ARTICLE MANIPULATING APPARATUS, June 10, 1975, shows an adaptive effector in the form of a manipulator arm with a complex photodetection system mounted near the gripper on the manipulator arm to provide X, Y and Z position data derived from related light emitting diodes reflecting off a specialized reflector on the target object.

U.S. Pat. No. 3,891,918, Ellis, LINEAR DISPLACEMENT TRANSDUCER UTILIZING AN OSCILLATOR WHOSE AVERAGE PERIOD VARIES AS A LINEAR FUNCTION OF THE DISPLACEMENT, June 24, 1975, shows a mechanical probe with displacement-sensitive solenoidal variable inductor.

U.S. Pat. No. 4,087,729, Yamazaki et al, POSITION FINELY ADJUSTING APPARATUS, May 2, 1978, shows a precision positioner using cylindrical piezoelectric transducers under the supervision of light beam detectors. A platform effector is supported by four bendable transducers and positioned by dynamic transducers.

U.S. Pat. No. 4,203,064, Suzuki et al, METHOD FOR AUTOMATICALLY CONTROLLING THE POSITION OF SMALL OBJECTS, May 13, 1980, shows a precision positioner with a resolver action operating by scanning and counting data marks on the target object.

The prior art does not show a precision microprobe with feedback position adaptability in X, Y and Z dimensions combined with pressure control.

SUMMARY OF THE INVENTION

The invention is a precision probe for use in electrically probing a complex microcircuit or other target object having diminutive probe pads or other probe locations of diminutive size.

Another object of the invention is to provide a feedback positionable precision probe with feedback adaptability in X, Y and Z dimensions.

Another object of the invention is to provide an intelligent probe which can aid in its own X-Y positioning and which has both Z positioning and pressure controlability.

Another object of the invention is to provide, in a precision probe, X-Y pad finding capability and Z pressure metering capability.

A feature of the invention is the combination of optical feedback controlled X, Y positioning and pressure feedback controlled Z positioning. The advantage of the invention is that it can perform multiple probing operations on a microcircuit without great cost or consumption of time, and without damage to the microcircuits.

The foregoing and other objects, features and advantages of the invention will be apparent from the more particular description of the preferred embodiments of

BRIEF DESCRIPTION OF THE DRAWINGS

In the drawings, like elements are designated with similar reference numbers, and identical elements in different specific embodiments are designated by identical reference numbers.

DESCRIPTION OF THE PREFERRED EMBODIMENT

Figure 1:
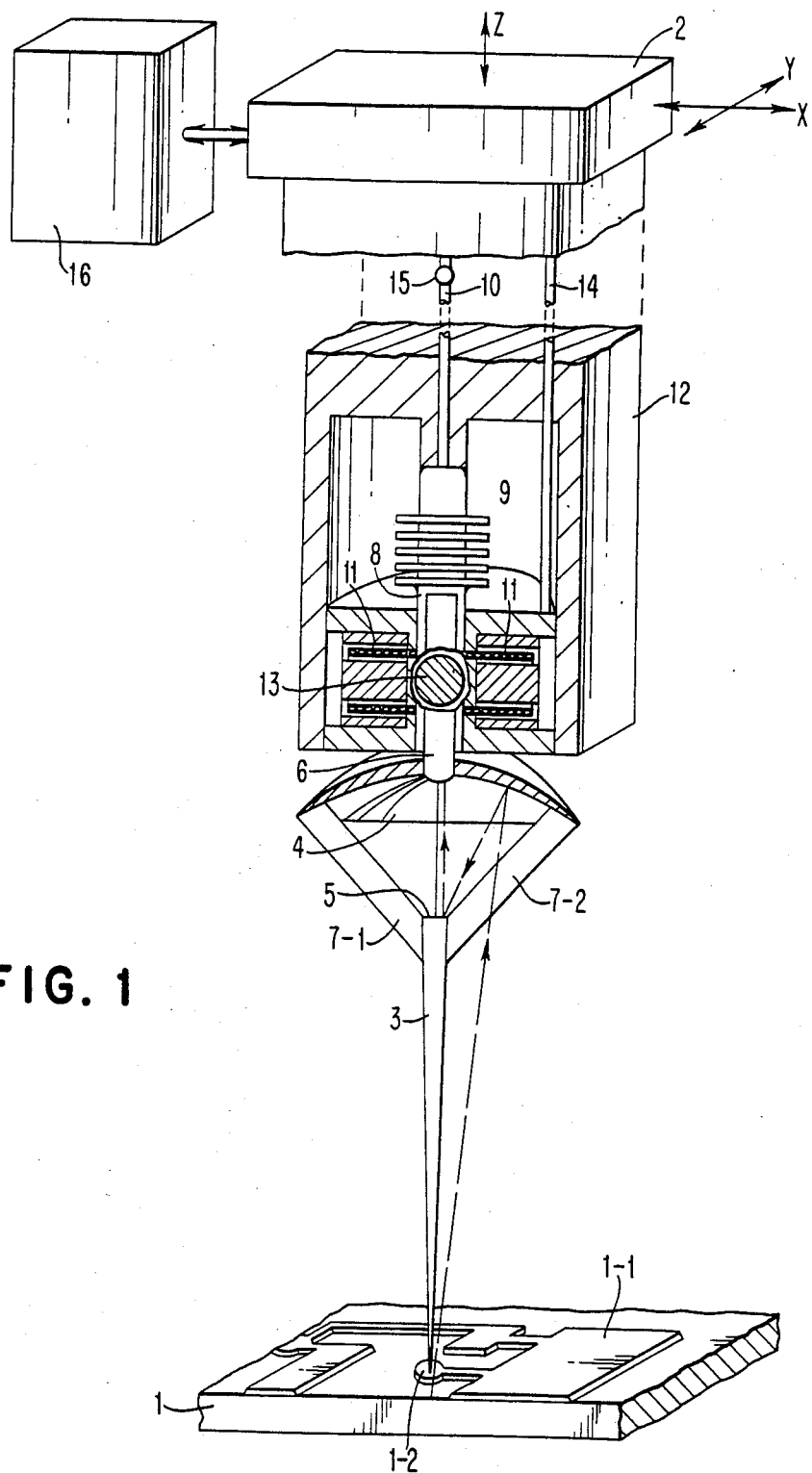
FIG. 1 shows the precision probe of the invention in a partially diagrammatic elevation view of the preferred embodiment precision probe with cutaway and with a target in position.

The precision probe system shown in FIG. 1 is arranged to inspect target 1 by means of positioning with coarse XYZ positioning mechanism 2 a guided microprobe 3 to make contact to circuitry 1-1 at a selected probe pad 1-2. Guidance for the precision probe is accomplished optically by light reflected from target 1-2 by a dual mirror focusing system of concave mirror 4 and flat mirror 5.

Light sensor 6 (which may be a simple transducer for a monofilament fiber optic or a complex transducer for a multifilament fiber optic, with detector to provide a recognition signal at the control mechanism, computer 16, when the microprobe 3 is aligned with a target) responds to light values reflected from microtarget areas such as probe pads 1-2. Multifilament fiber optics lend themselves to elegant null techniques for developing displacement signals directly, but with the computer available such signals can be developed from multiple samples during scanning or from threshold detection as the microprobe passes from reflective to nonreflective microtarget or the converse. Up and down Z positioning of the microprobe is carried out by a shaft 8 positioned by an air diaphragm 9 which is driven to the target by applied air pressure delivered via an air tube 10, and retracted by atmospheric pressure when the air pressure via tube 10 is diminished.

Target 1 has its circuit (target) areas 1-1 reflective and its open (background) areas relatively light-absorbing. Microprobe 3 is carried on three basket supports 7 (7-1 and 7-2 visible in FIG. 1) to allow for light entry.

In operation, the microprobe 3 is coarsely positioned by the computer 16 and the coarse positioner 2 in the airspace above the X-Y coordinates for the probe pad 1-2, but tolerances may be such that the microprobe 3 is not precisely positioned within the airspace periphery of the probe pad. Probing the edge of the pad could cause damage or false open readings; probing off the pad could cause false open readings. Assuming that the precision required is greater than the tolerances available or desired, fine positioning is required. Fine positioning with guidance sensing, using computer preparation of fine positioning control signals and control signal responsive mechanisms built into the microprobe, accomplishes the fine positioning. Precision X-Y positioning is carried out by X transducer means and Y transducer means (the voice coil microactuators 11 and 13, respectively, in conjunction with stators built into probe carrier 12), in response to computer control signals delivered via the control cable 14. Pneumatic control valve 15 is the Z control. It may contain a safety valve or other variable setting maximum pressure means. Pneumatic control valve 15 is responsive to control computer 16, for providing control signals to the Z fine positioning means 1 (3-11 and 13) of probe carrier 12, to transport the probe tip to contact the surface of the selected microtarget (1-2, 2-1) and apply probe contact pressure within a specified range, and selectively to withdraw the probe from contact with the selected microtarget.

MIRRORLESS EMBODIMENT

An alternate way to implement the sensing and probing functions (shown in FIG. 2) separate from those shown in FIG. 1, is to imbed an optical focusing fiber 3-1 in a lumen coaxial to the sensing probe 3. For maximum resolution the fiber optic should be of the single mode type. As is known in the art, the sensing fiber can also be used to illuminate the surface of circuitry 2-1 to be probed.

In addition, the tip of the probe may be fitted with a rod lens. It is understood that the apparatus having the probe tip with concentric optical fiber may utilize the same X, Y and Z positioning mechanism 2 as shown in the FIG. 1 embodiment, namely voice coil actuators and a pneumatic bellows device, or their equivalents.

Figure 2:
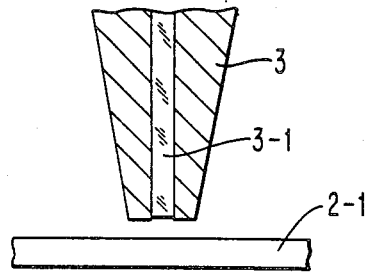
FIG. 2 is a greatly magnified cutaway elevation view of the tip of the precision probe according to an alternative embodiment.

It is clear that the FIG. 2 embodiment offers a solution at lower cost and complexity than the embodiment shown in FIG. 1, but in some environments it may be desirable to perform the optical sensing away from the surface.

Figure 3:
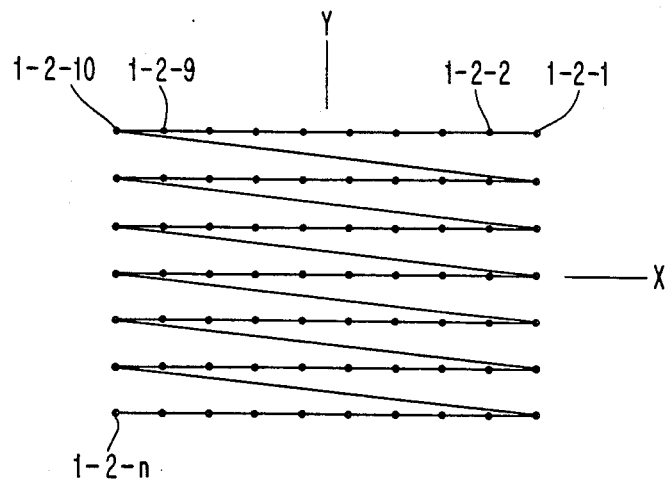
FIG. 3 is a plan diagram illustrating one possible layout of probe pads on a target, together with a representative path of probe travel to traverse the pads.

FIG. 3 shows a representative probing operation showing one way to traverse for probing each of pads 1-2-1, 1-2-2 ... 1-2-9, 1-2-10 ... 1-2-n in a regular array such as might be presented by a semiconductor chip.

Optical sensing disclosed in the preferred embodiments may in certain environments be advantageously replaced by other types of non-contact radiation sensing, such as heat sensing, microwave or the like.

The foregoing and other objects, features and advantages, and changes to adapt the robot probe positioner to the special requirements of the target device to be probed, will be obvious to those skilled in the art of testing miniaturized circuits, in keeping with the invention as defined in the following claims.

What is claimed is:

1. A precision probe system for probing a target optically distinguishable from a background, the probe system having coarse X-Y-Z positioning mechanism, effector mechanism and control mechanism characterized by
   (a) effector carriage means coarsely positionable by the coarse X-Y-Z positioning mechanism in the general vicinity of a microtarget;
   (b) microprobe means having a probe carrier and probe arranged with limited X-Y-Z freedom in said effector carriage means, said probe having a probe tip and a probe mounting end opposite said probe tip along an axis;
   (c) optical sensing means, mounted in fixed relationship to said microprobe means, for providing a recognition signal at the control mechanism when said microprobe means is aligned with a microtarget;
   (d) optical focusing means, substantially coaxial with said microprobe means, operative to transmit light with minimal loss from probe tip to probe mounting end of said probe;

(e) X transducer means operatively associated with said probe carrier to provide fine positioning for said probe carrier in the X dimension;

(f) Y transducer means operatively associated with said probe carrier to provide fine positioning for said probe carrier in the Y dimension;

(g) Z transducer means operatively associated with said probe carrier to provide fine positioning for said probe carrier in the Z dimension, having controllable position until impeded in travel in the Z dimension and, when impeded, having controllable pressure;

(h) microprobe mounting means attaching said probe at its probe mounting end to said microprobe carrier means;

(i) X-Y control connection means, responsive to the control mechanism, for providing control signals to said X fine positioning means and to said Y fine positioning means, to position said probe within the microtarget airspace;

(j) Z control connection means, responsive to the control mechanism, for providing control signals to said Z fine positioning means, to transport said probe tip to contact the surface of the selected microtarget and apply probe contact pressure within a specified range, and selectively to withdraw said probe from contact with the selected microtarget.

2. A precision probe system according to claim 1 further characterized in that
said Z fine positioning means comprises an air bellows, and said Z control connection means comprises a reversible controlled air pressure-vacuum transducer and variable setting maximum pressure means.

3. A precision probe system according to claim 1 further characterized in that
said optical sensing means (c) comprises dual mirror means including a concave reflector mounted on said probe carrier centered about an extension of the axis of said probe, inside said microprobe mounting means (h), and including flat reflector surface arrayed parallel to the axis of said probe at its probe mounting end, positioned in line with the axis of said microprobe means in operative juxtaposition with said X-Y control connection means (i).

4. A precision probe system according to claim 1 further characterized in that
said optical sensing means (c) comprises an internal lumen, substantially axial to said probe, extending from probe tip to probe mounting end in operative juxtaposition with said X-Y control connection means (i).

5. A precision probe system for probing a target remotely distinguishable from a background, the probe system having coarse X-Y-Z positioning mechanism, effector mechanism and control mechanism characterized by (a) effector carriage means coarsely positionable by the course X-Y-Z positioning mechanism in the general vicinity of a microtarget;

(b) microprobe means having a probe carrier and probe arranged with limited X-Y-Z freedom in said effector carriage means, said probe having a probe tip and a probe mounting end opposite said probe tip along an axis;

(c) remote sensing means, mounted in fixed relationship to said microprobe means, for providing a recognition signal at the control mechanism when said microprobe means is aligned with a microtarget;

(d) radiation focusing means, substantially coaxial with said microprobe means, operative to transmit a physical representation from probe tip to probe mounting end of said probe, for providing a physical representation to said remote sensing means for use in sensing a target in line with said microprobe means;

(e) X transducer means operatively associated with said probe carrier to provide fine positioning for said probe carrier in the X dimension;

(f) Y transducer means operatively associated with said probe carrier to provide fine positioning for said probe carrier in the Y dimension;

(g) Z transducer means operatively associated with said probe carrier to provide fine positioning for said probe carrier in the Z dimension, having controllable position until impeded in travel in the Z dimension and, when impeded, having controllable pressure;

(h) microprobe mounting means attaching said probe at its probe mounting end to said microprobe carrier means;

(i) X-Y control connection means, responsive to the control mechanism, for providing control signals to said X fine positioning means and to said Y fine positioning means, to position said probe within the microtarget airspace;

(j) Z control connection means, responsive to the control mechanism, for providing control signals to said Z fine positioning means, to transport said probe tip to contact the surface of the selected microtarget and apply probe contact pressure within a specified range, and selectively to withdraw said probe from contact with the selected microtarget.

6. A precision probe system according to claim 5 further characterized in that
said Z fine positioning means comprises an air bellows, and said Z control connection means comprises a reversible controlled air pressure-vacuum transducer and variable setting maximum pressure means.

* * * * *